United States Patent
Yu et al.

(10) Patent No.: US 7,449,744 B1
(45) Date of Patent: Nov. 11, 2008

(54) NON-VOLATILE ELECTRICALLY ALTERABLE MEMORY CELL AND USE THEREOF IN MULTI-FUNCTION MEMORY ARRAY

(75) Inventors: Andy Yu, Palo Alto, CA (US); Ying W. Go, Palo Alto, CA (US)

(73) Assignee: Nanostar Corporation, San Jose, CA (US)

( * ) Notice: Subject to any disclaimer, the term of this patent is extended or adjusted under 35 U.S.C. 154(b) by 0 days.

(21) Appl. No.: 10/910,198

(22) Filed: Aug. 3, 2004

(51) Int. Cl.
H01L 23/62 (2006.01)
H01L 29/93 (2006.01)

(52) U.S. Cl. .................. 257/316; 257/318; 257/319; 257/550; 438/293

(58) Field of Classification Search ............... 257/316, 257/318, 319, 550; 438/201, 293
See application file for complete search history.

(56) References Cited

U.S. PATENT DOCUMENTS

| | | |
|---|---|---|
| 4,959,812 A | 9/1990 | Momodomi et al. |
| 4,980,861 A | 12/1990 | Herdt et al. |
| 5,414,693 A | 5/1995 | Ma et al. |
| 5,949,711 A | 9/1999 | Kazerounian |
| 6,191,975 B1 | 2/2001 | Shimizu et al. |
| 6,274,909 B1 * | 8/2001 | Chang et al. ............... 257/355 |
| 6,462,375 B1 | 10/2002 | Wu |
| 6,730,959 B1 * | 5/2004 | Hung et al. ................. 257/316 |
| 6,803,276 B2 | 10/2004 | Kim et al. |
| 7,015,550 B2 * | 3/2006 | Sugimae et al. ............ 257/365 |
| 2005/0127428 A1 * | 6/2005 | Mokhlesi et al. ........... 257/315 |

OTHER PUBLICATIONS

A Dual Gate Flash EEPROM Cell With Two-Bits Storage Capacity; M. Lorenzini, M. Rudan, et al.; 1996 IEEE; 1996 Int'l. NonVolatile Memory Technology Conferences.
A Dual Gate Flash EEPROM Cell With Two-Bits Storage Capacity; M. Lorenzini, et al.; 1997 IEE; Transactions on Components, Packaging and Mfg. and Mfg. Technology-PartA, vol. 20, No. 2 Jun. 1997.

* cited by examiner

*Primary Examiner*—Howard Weiss
*Assistant Examiner*—Steven H Rao
(74) *Attorney, Agent, or Firm*—Edward C. Kwok; MacPherson Kwok Chen & Heid LLP

(57) ABSTRACT

A multi-function memory array that includes a DRAM distributed in several DRAM sectors, a Flash EEPROM distributed in several Flash EEPROM sectors, a data bus interconnecting the DRAM sectors and the Flash EEPROM sectors, and a plurality of memory access control circuitries. Each DRAM sector and Flash EEPROM sector can be accessed independently and data can be transferred between a DRAM sector and a Flash EEPROM sector. External data can also be written into either DRAM or Flash EEPROM. Flash EEPROM in one sector is distributed in rows and columns, and cells in each column are separated from the cells in an adjacent column by deep trench isolation regions.

15 Claims, 8 Drawing Sheets

A-A View

B-B View

Aries Flash, P-Type (130nm, Tox=93A)

| Erase (FN) | | |
|---|---|---|
| | select | unselect |
| BL | x | x |
| SL | Vpp | Vcc to 0v |
| WL | Vnn | Vcc to 0v |
| DSG | Vpp | Vpp |
| SSG | 0v | Vpp |
| well | Vpp | Vcc |

| Program(Soft avalanche hot electron)(SAHE) | | |
|---|---|---|
| | select | unselect |
| BL | Vnn | x |
| SL | x | x |
| WL | 10v | Vnn |
| DSG | (-10v) | Vcc(unsel sector) |
| SSG | Vcc | Vcc |
| well | 0v to Vcc | 0v to Vcc (unsel column) |

| Read | | |
|---|---|---|
| | select | unselect |
| BL | Vrd | Vcc |
| SL | Vcc | Vcc |
| WL | Vcc to 0v | Vcc to 0v |
| DSG | 0v to -2v | Vcc |
| SSG | 0v | 0v |
| well | Vcc | Vcc |

Note A:
1. Vnn = -4v to -8v
2. Vpp = 7v to 12v

FIG. 9

NON-VOLATILE ELECTRICALLY ALTERABLE MEMORY CELL AND USE THEREOF IN MULTI-FUNCTION MEMORY ARRAY

BACKGROUND OF THE INVENTION

1. Field of the Invention

The present invention relates to logic gate structures, and particularly, to a Flash electrically erasable and programmable read-only memory (Flash EEPROM) and its use in a multi-function memory array.

2. Description of the Related Art

Electrically erasable and programmable non-volatile semiconductor devices, such Flash EEPROMs are well known in the art. One type of Flash EEPROM employs metal-oxide-semiconductor (MOS) floating gate devices. Typically, an electrical charge is transferred into an electrically isolated (floating) gate to represent one binary state, while an uncharged gate represents the other binary state. The floating gate is generally placed above and between two regions (source and drain) spaced-apart from each other and separated from those regions by a thin insulating layer, such as a thin oxide layer. An overlying gate is disposed above the floating gate provides capacitive coupling to the floating gate, allowing an electric field to be established across the thin insulating layer. "Carriers" from a channel region under the floating gate are injected through the thin insulating layer into the floating gate to charge the floating gate. The presence of the charge in the floating gate consequently indicates the logic state of the floating gate, i.e., 0 or 1.

Dynamic random access memory (DRAM) devices are also well known in the art. Generally, after manufacture, each DRAM device is tested for quality. Each DRAM device is tested with writing and reading testing patterns from an external memory location into the DRAM device. If defects are detected, the testing system may try to correct the problem by isolating a defective memory row or column and re-routing the data to a redundant memory row or column. The testing and the correction are generally done on some testing machines and the testing patterns and re-routing patterns are read from memory locations provided by the testing machines.

SUMMARY OF THE INVENTION

The system and method of the invention provide a Flash EEPROM with lesser disturbance during programming of memory cells. The Flash EEPROM according to the invention employs a deep trench isolation (DTI) region to allow voltage control of a well where a target Flash EEPROM cell resides. By controlling the well voltage, fewer electrons will flow to adjacent memory cells, thus preventing programming of unselected memory cells. Another system and method of the invention place a Flash EEPROM and a DRAM in multi-function memory array within a same die. A multi-function memory array according to the invention combines an array of DRAM with an array of Flash EEPROM in one single memory chip, thus allowing data to be transferred between DRAM and Flash EEPROM. The multi-function memory array enables Flash EEPROM be used as a storage element for DRAM for redundancy address, repair information, and production information, thus Flash EEPROM can provide re-routing information for bad DRAM cells that will be replaced by working redundant DRAM cells. Finally, a DRAM cell of the invention employs a transistor and a capacitor, wherein the capacitor function is provided by a Flash EEPROM cell. The use of a Flash EEPROM cell simplifies the manufacturing process of a DRAM.

In one aspect, the invention is an electrically alterable non-volatile memory device. The memory device includes a first semiconductor layer doped with a first dopant in a first concentration, and a second semiconductor layer, adjacent the first semiconductor layer, doped with a second dopant that has an opposite electrical characteristic than the first dopant. The second semiconductor layer has a top side where two spaced-apart diffusion regions are embedded, and each diffusion region doped with the first dopant in a second concentration greater than the first concentration. The two diffusion regions includes a first diffusion region and a second diffusion region, and a first channel region is defined between the first diffusion region and the second diffusion region. The memory device also includes a first and a second deep trench isolation regions. The first deep trench isolation region is disposed adjacent to the first diffusion region, and the first deep trench isolation region extends from the first diffusion region to the first semiconductor region. The first deep trench isolation region separates one memory cell transistor from an adjacent memory cell transistor. The second deep trench isolation region is disposed adjacent to the second diffusion region, and the second deep trench isolation region extends from the second diffusion region to the first semiconductor region. The second deep trench isolation region separates one memory cell transistor from an adjacent memory cell transistor. The memory device further includes a floating gate and a control gate. The floating gate includes a conductive material with a top side and at least two opposing lateral sides. The floating gate is disposed between the first diffusion region and the second diffusion region and above the first channel region and separated therefrom by a first insulator region, and the floating gate is capable of storing electrical charge. The control gate includes of a conductive material and is disposed on the top of the floating gate. The control gate surrounds the floating gate on at least two opposing lateral sides and the top side, and the control gate is separated from the floating gate by an insulator layer.

In another aspect, the invention is an electrically alterable memory array. The electrically alterable memory array includes a plurality of electrically alterable memory cells, a plurality of word select lines, a plurality of source select lines, a plurality of data select lines, and a plurality of deep trench isolation regions. Each memory cell has a first connector, a second connector and a third connector, the plurality of memory cells are distributed in rows and columns, wherein the memory cells of each column are placed within a single well. Each word select line connects to the second connector of each memory cell in one row. Each source select line connects to the first connector of each memory cell in one column, and each source select line is enabled by one source select gate. Each data select line connects to the third connector of each memory cell in one column, and each data select line is enabled by one data select gate. Each deep trench isolation region separates two columns of the memory cells, wherein the well for one column of the memory cells can be placed at a predefined voltage when programming a memory cell in the well.

In another aspect, the invention is a multi-function memory array. The multi-function memory array includes a plurality of dynamic random access memory (DRAM) cells, a plurality of dynamic memory access control units, a dynamic memory cell address decoder, a plurality of electrically alterable non-volatile memory cells, a plurality of electrically alterable non-volatile memory access control units, an electrically alterable non-volatile memory cell address decoder, and a data bus. The DRAM cells are distributed in a plurality of DRAM sectors, wherein one DRAM sector can be read while a data is being written into another DRAM sector. Each DRAM cell includes a select transistor, and a data storage unit having a capacitor region for storing data. Each dynamic memory access control unit controls access to the DRAM cells in each DRAM sector, and the dynamic memory cell address decoder provides access addresses to each DRAM sector. The electrically alterable non-volatile memory cells are distributed in a plurality of electrically alterable non-volatile memory sectors. Each electrically alterable non-volatile memory cell includes a floating gate with at least two lateral sides and a top side and a control gate. The floating gate is placed between one source region and one drain region and capable of storing data. The control gate surrounds the floating gate on the at least two lateral sides and the top side, wherein one electrically alterable non-volatile memory cell is separated from an adjacent electrically alterable non-volatile memory cell in a same row by a deep trench isolation. Each electrically alterable non-volatile memory access control unit controls access to the electrically alterable non-volatile memory cells in each electrically alterable non-volatile memory sector. The electrically alterable non-volatile memory cell address decoder provides access addresses to each electrically alterable non-volatile memory sector. The data bus connects the plurality of dynamic memory access control units and the plurality of electrically alterable non-volatile memory access control units, wherein a data from a DRAM cell can be written into an electrically alterable non-volatile memory cell and a data from the electrically alterable non-volatile memory cell can be written into the DRAM cell.

Other advantages and features of the present invention will become apparent after review of the hereinafter set forth Brief Description of the Drawings, Detailed Description of the Invention, and the Claims.

BRIEF DESCRIPTION OF THE DRAWINGS

FIG. 9 is a table illustrating a set of operating voltage according to one embodiment of the invention.

DETAILED DESCRIPTION OF THE INVENTION

Figure 1:
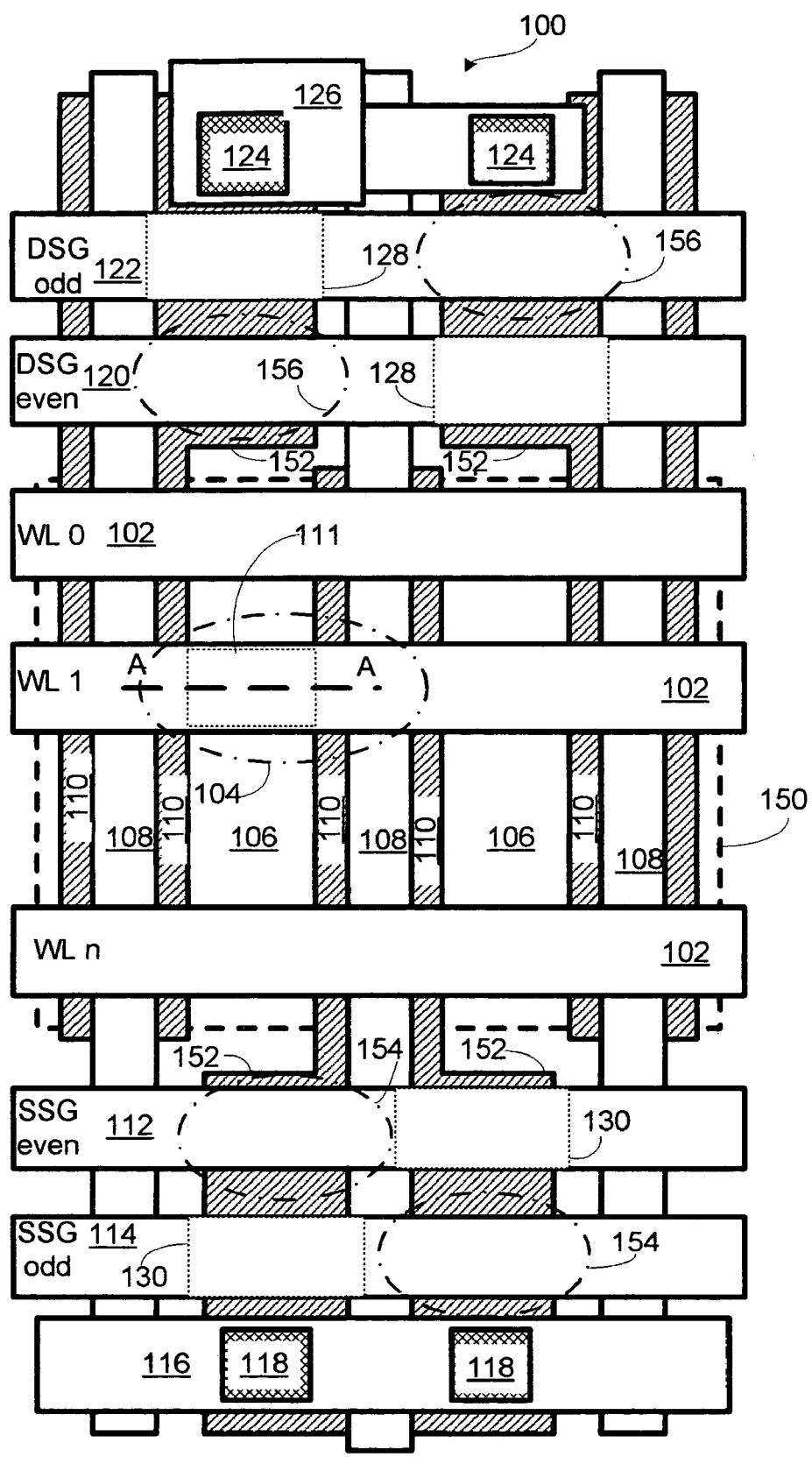
FIG. 1 is a top plan-view of a plurality of a Flash EEPROM array according to one embodiment of the invention.

FIG. 1 illustrates a Flash EEPROM array 100. The Flash EEPROM array 100 includes a plurality of word select lines 102 running horizontally, a plurality of well regions 106 running vertically across several word lines, and a plurality of diffusion regions 110 running vertically along the well regions 106. Each well region 106 is surrounded by two deep trench isolation regions 108. Two diffusion regions 110 are placed on the top of each well region 106. One diffusion region 110 serves as a source and other diffusion region 110 serves as a drain. A floating gate 111 is placed between the diffusion regions 110 and under the word select line 102. The floating gate, the word select line 102, the well region 106, and two adjacent diffusion regions 110 form a memory cell 104. The Flash EEPROM array 100 also includes a plurality of source select gates 112, 114, and a plurality of data select gates 120, 122. A diffusion region 110 is connected to an extended diffusion region 152, which is used to form either a source select transistor 154 or a data select transistor 156. A memory cell 104 is selected by activating a word select line 102, a proper source select gate, and data select gate. The source diffusion region is connected to a power source 116 via a metal contact 118. The data is read from a data line 126 through another metal contact 124 connected to the drain diffusion region. The metal contacts 118 and 124 are preferably in square shape. Each memory cell 104 is separated from a memory cell in the same memory row by a deep trench isolation region 108. The deep trench isolation region 108 separates one well region 106 from another adjacent well region 106 and allows one well region be placed at a particular voltage during programming of the memory cell 104. Placing a well region at a particular voltage prevents electrical charges from traveling to unselected memory cells, thus preventing programming of unselected memory cells.

There is a buried diffusion region 128 under DSG odd 122 in left column, so the select gate formed under DSG odd 122 is always turned on. Similarly, the select gate formed under DSG 120 is also always on with a similarly buried diffusion region 128. Other buried diffusion regions 130 perform a similar function for SSG even 112 and SSG odd 114.

The word select lines 102 are separated by channel stop implants 150. The channel stop implants 150 are formed after the word select lines 102 have been formed. The channel stop implants 150 are implanted with dopants of opposite characteristics used to form the diffusion region 110. The channel stop implants 150 provide isolation between memory cells.

Figure 2:
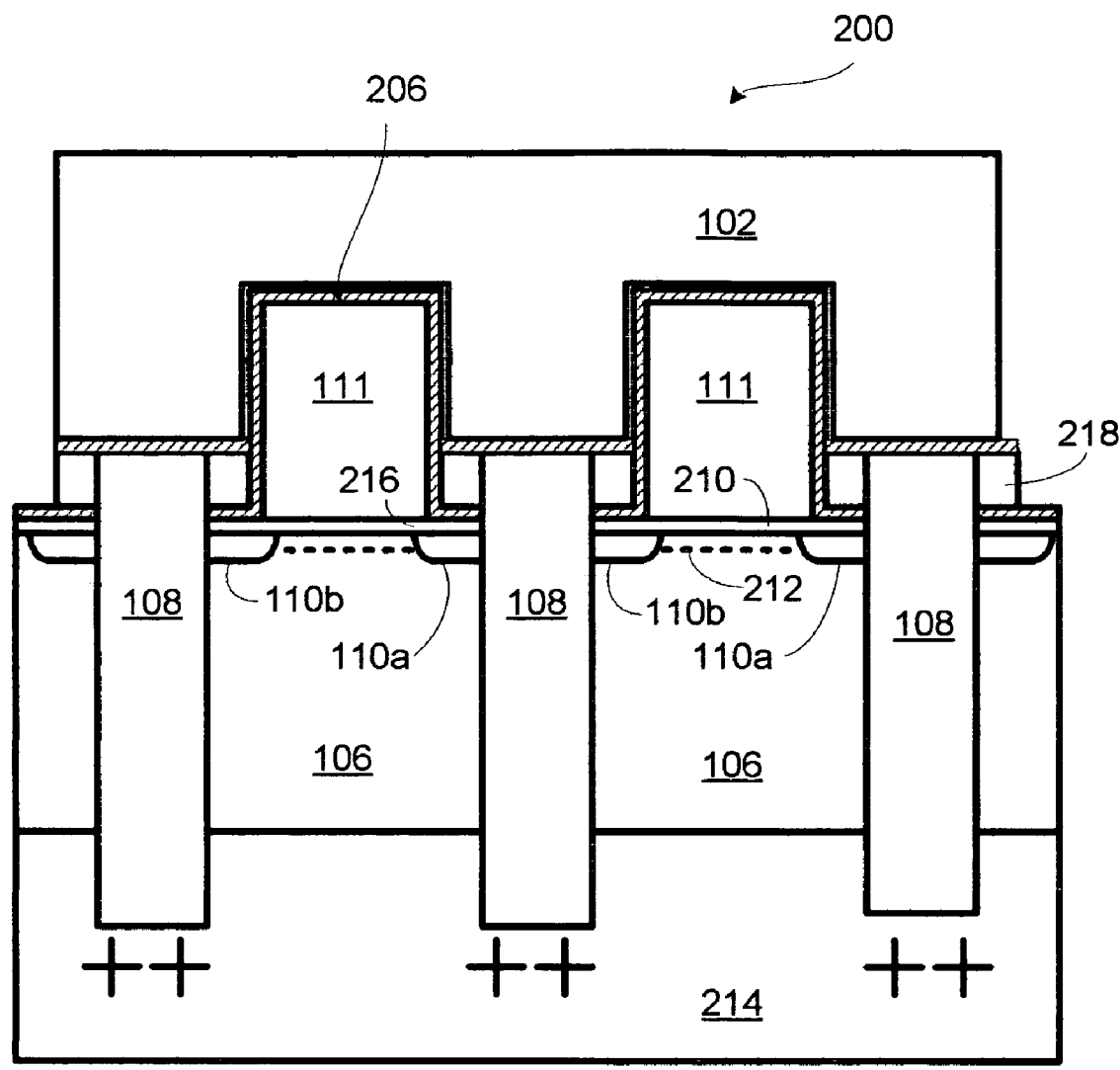
FIG. 2 is a cross sectional view of a memory cell taken along line A-A of FIG. 1.

FIG. 2 illustrates a cross section view of a Flash EEPROM cell 104 along line A-A in FIG. 1. The memory cell 104 includes a semiconductor substrate 214 and a well 106 on the top of the substrate 214. The substrate 214 is doped with a first dopant, which can be either N type or P type. The well 106 is a semiconductor doped with a second dopant with an electrical characteristic that is opposite of the first dopant. Two spaced-apart diffusion regions 110a and 110b are placed on the top side of the well 106. The diffusion regions 110a, 110b are doped with the same dopant used for doping the substrate 214 but doped with a concentration that is higher than that of the substrate 214. A channel region 212 is defined between two diffusion regions 110a, 110b. An insulating layer 210 is placed on the top of the well 106 and the diffusion regions 110a, 110b. The insulating layer 210 may be formed by an insulating oxide material or other suitable insulating materials. Though FIG. 2 illustrates the diffusion regions 110a, 110b implemented in a single well, it is understood that other implementations, such as twin wells, triple wells, or oxide isolation well may also be used. The separation of the memory cells 104 are accomplished through deep trench isolation (DTI) 108, which extends from the substrate 214 up to above the well 106.

A floating gate 111 preferably made from a polysilicon material is placed above the insulating layer 210 and overlapping the diffusion regions 110a, 110b. The floating gate 111 overlaps slightly with the diffusion regions 110a, 110b, however, excessive overlapping may reduce the length of the channel region 212. The floating gate 111 is separated from the diffusion regions 110 by a tunnel channel 216 (also known as tunnel oxide) of the insulating layer 210. The thickness of the tunnel channel 216a should be thin enough to allow removal of electrons from the floating gate 111 under the Fowler-Nordheim tunneling mechanism, but thick enough to prevent the occurrence of a leakage current between the first floating gate 111 and the well 106. The width of DTI 108 can be smaller than one lambda, where the lambda is defined by the technology used. For example, if the technology uses 0.18 μm, then one lambda is defined as 0.18 μm.

A control gate 102, which is part of the word select line, is placed above the floating gate 111 and covering the floating gate 111 on the top side and two lateral sides. The control gate 102 is separated from the floating gate 111 by an insulating layer 206. The insulating layer 206 can be oxide-nitrate-oxide (ONO) or other suitable material. Because of greater exposure of the surface of a floating gate 111 to the control gate 102, greater the coupling ratio between the control gate's voltage and the floating gate voltage can be achieved. The control gate 102 is separated from the lateral sides of the floating gate 111 by the isolating layer 206. The control gate 102 may be formed by a polysilicon grown at a different stage as the floating gate 111. The control gate 102 in one memory cell 104 is connected to control gates in other memory cells 104 in the same memory word line.

An insulating oxide layer 218 is placed between the control gate 102 and the source/drain region 110. The layer 218 may be of same material as the DTI 108, but grown at difference phases of the process. The layer 218 lowers the capacitance on the source/drain region 110 and allows fast data reading from the memory cell 104.

When a voltage is applied to the control gate 102, through a coupling effect, a voltage is induced on the floating gate 111. The coupling effect depends on the thickness of the layer separating the control gate 102 from the floating gate 111. A capacitance is formed between the control gate 102 and the floating gate 111. If the layer separating the control gate 102 and the floating gate 111 is too thin, a leakage current may occur between these two gates when the floating gate is charged with electrons. If the layer is too thick, the coupling ratio may be low and resulting in a low voltage in the floating gate. A good coupling ratio is between 50%-80%, i.e., a 10 V applied to the control gate 102 results in 5 V to 8 V induced in the floating gate 111. The combination of the control gate 102, the floating gate 111, and the diffusion regions 110a and 110b forms a control transistor.

The induction of voltage on the floating gate 111 is important when erasing or programming the memory cell 104. When programming the memory cell 104, a positive high voltage (8 V-11 V) is applied to the control gate 102. The well 106 is also left between 0 V and Vcc. A negative voltage between −4V and −8V is applied to the diffusion region 110b, which is connected to an external bit line. The positive high voltage applied to the control gate 102 induces a positive voltage on the floating gate 111. The reversely biased junction between bit line and well is in soft avalanche breakdown condition that will generate hot electrons. The potential difference between the floating gate 111, diffusion region 110b and the well 106 induces electrons be injected into the floating gate 111. Once electrons are inside of the floating gate 111, the floating gate 111 may hold the electrons for years.

To erase a memory cell 104, a negative voltage Vnn is applied to the control gate 102 and the well 106 is set to a positive voltage Vpp. The negative voltage applied to the control gate 102 is coupled to the floating gate 111. The negative voltage of the floating gate 111 and the positive voltage at the well 106 force the electrons to discharge from the floating gate 111 into the well 106, thereby erasing the memory cell 104.

To read the memory cell 104, the diffusion region 110a is connected to Vcc, and the control gate 102 is set between 0V and Vcc. If the floating gate 111 is charged with electrons, a channel will be established between diffusion regions 110a and 110b and current flows between these two regions. A sense-amplifier connected to a bit line connected to the diffusion region 110b will be able to detect the current, thereby recognizing that the floating gate 111 is charged with electrons. If the floating gate 111 is not charged with electrons, no channel is established between the diffusion regions 110a and 110b and the sense-amplifier will not be able to detect any current. The absence of a current between the diffusion regions 110a and 110b indicates the floating gate 111 is without electrons or with very few electrons. A floating gate 111 with electrons is assigned a first logic state while a floating gate 111 without electrons is assigned a second, opposite logic state.

Figure 3:
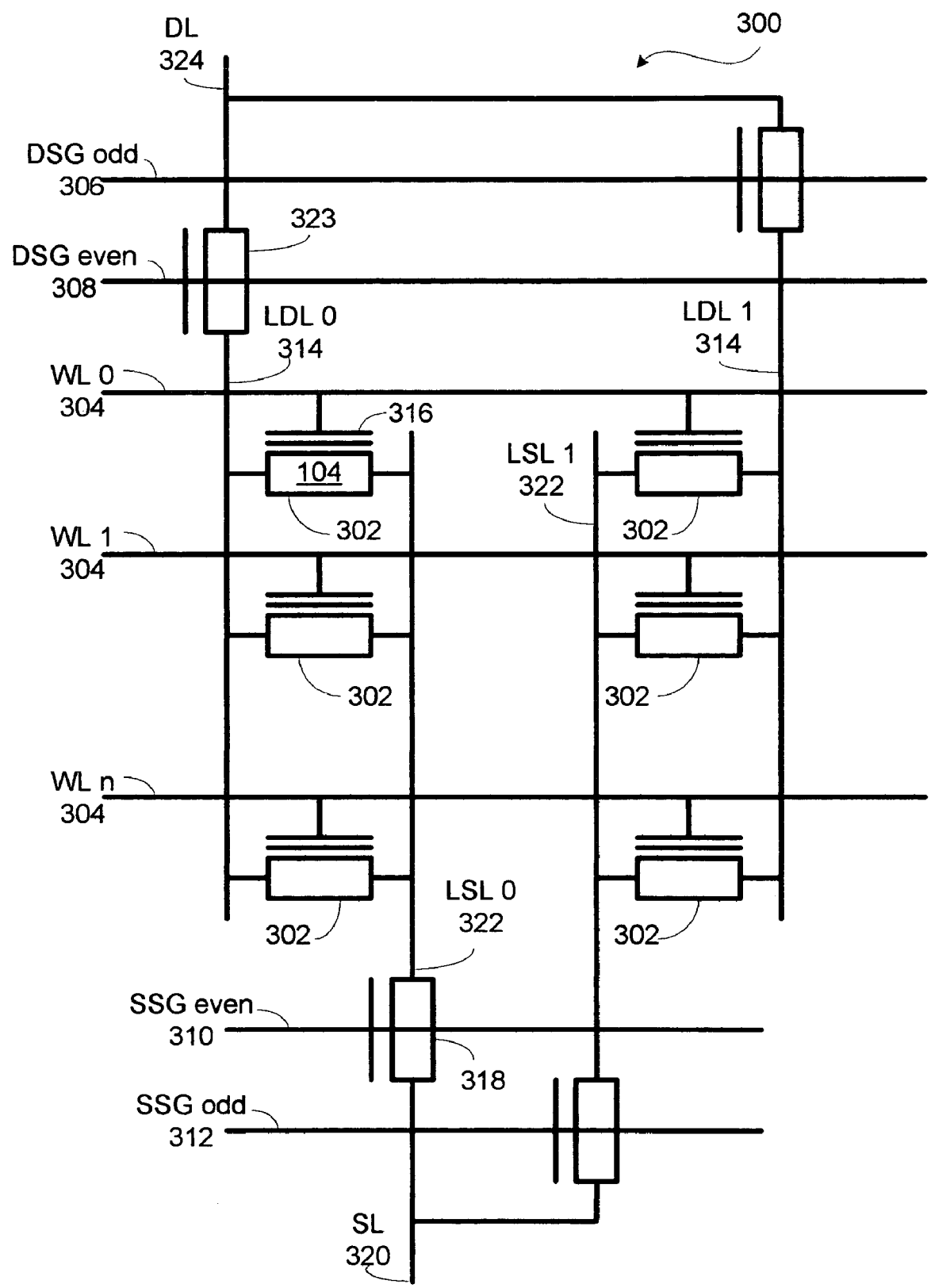
FIG. 3 is a schematic view of the memory array of FIG. 1.

FIG. 3 is a schematic diagram 300 for a Flash EEPROM array of FIG. 1. A plurality of the memory cells 302 are distributed in rows and columns. Each memory cell 302 has three external connectors: a control gate connector, a source connector, and a drain connector. The control gate connector connects the control gate 102 of the memory cell 104 to the word select line 304. The source connector connects the source region 110a of the memory cell 104 to a column source line 322. The drain connector connects the drain region 110b of the memory cell 104 to a column drain line 314. The following is a description of a process for reading a data from a memory cell 316. To read the data inside a memory cell 316, the word select line (WL 0) 304 is activated, and the local source line (LSL 0) 322 is also activated. The local source line (LSL 0) 322 is activated by activating the even source select line (SSG even) 310, and the activation of SSG even 310 turns on the source select transistor 318 and connecting the source line 320 to the local source line (LSL 0) 322. The electrical charges flows from the source line 320 to the memory cell 316. If the memory cell 316 is with data, the channel under the floating gate will be on and the electrical charges flows from the local source line 322 to the local drain line (LDL 0) 314. The even data select line (DSG even) 308 is activated to turn on the data select transistor 323, and the electrical charges can be detected by the data line 324. The presence of electrical charges or current at the data line 324 indicates the presence of data at the memory cell 316. If the memory cell 316 is without data, then there will be no flow of electrical current from the local source line 322 to the local drain line 314 and no electrical charge will be detected at the data line 324.

Figure 4:
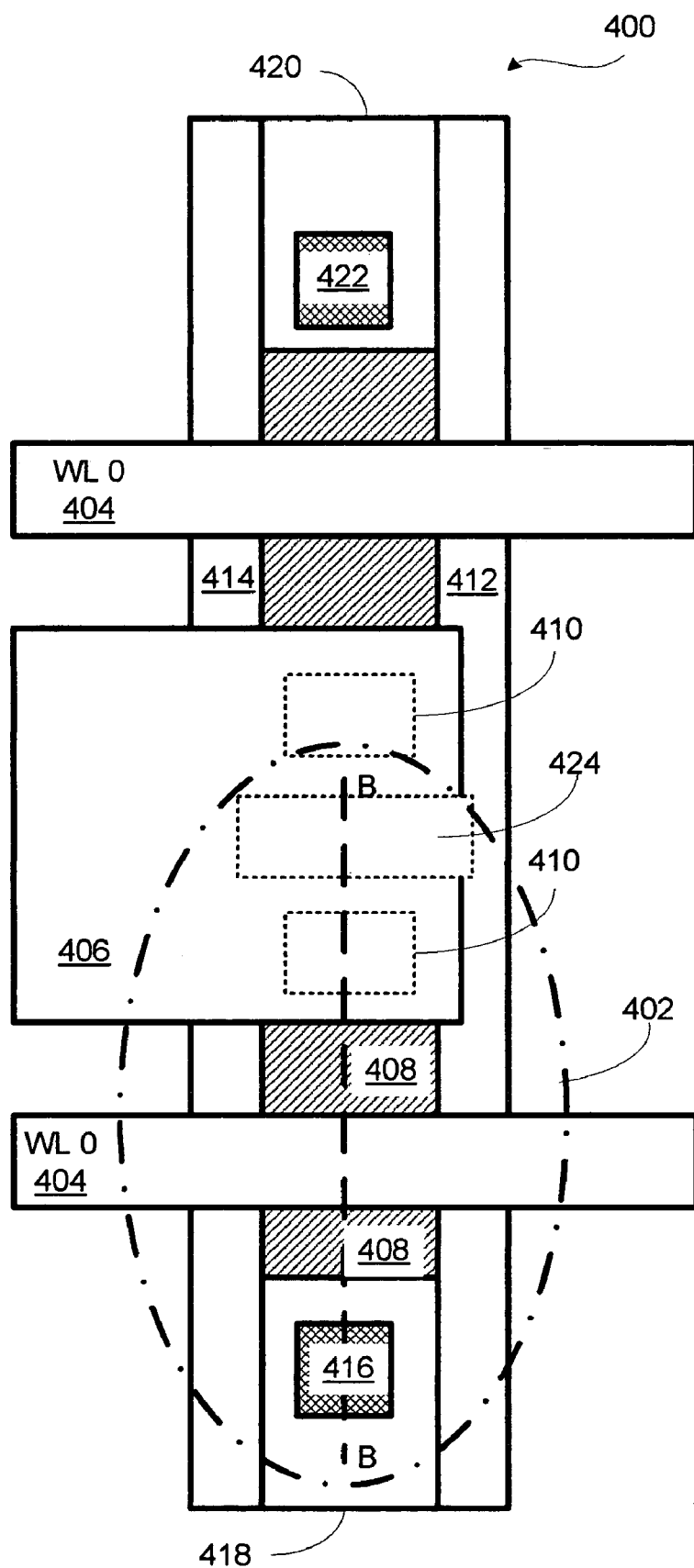
FIG. 4 is a top plan view of a plurality of modified DRAM cells according to one embodiment of the invention.

FIG. 4 is a top plan view 400 of a plurality of modified DRAM cells. Each modified DRAM cell 402 is defined by a transistor formed by a word select line 404 over two diffusion regions 408 and a capacitor function provided by a Flash-EEPROM-like cell formed by a control node 406 and a polysilicon node 410 underneath it. Each DRAM cell 402 in one column is separated from an adjacent DRAM cell in the same column by one deep trench isolation region 424. The DRAM cells 402 in one column is separated from DRAM cells of adjacent column by shallow trench isolation regions 412, 414. The data in DRAM cell 402 is read from a bit line 418 that is connected to the diffusion region 408 through a metal contact 416.

Figure 5:
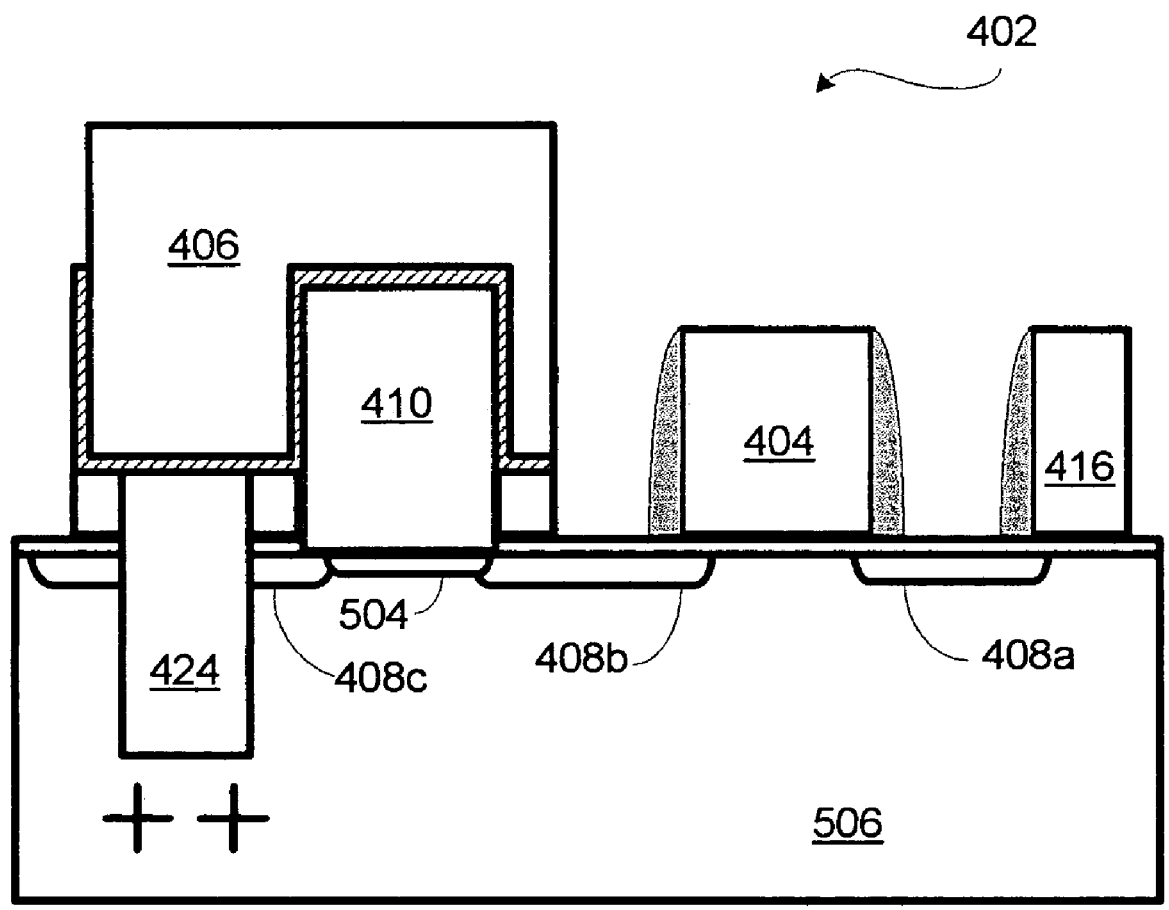
FIG. 5 is a cross sectional view of a modified DRAM memory cell taken along line B-B of FIG. 4.

FIG. 5 is a cross section view of a DRAM cell 402 taken along line B-B in FIG. 4. The DRAM cell 402 includes a well 506 doped with a first dopant and a plurality of diffusion regions 408 are placed on the top side of the well 506. The diffusion regions 408 are doped with a second dopant. A transistor is formed by the word select line 404 placed between two diffusion regions 408a and 408b. The capacitor function is provided by a Flash-EEPROM-like cell structure disposed above the diffusion regions 408b and 408c. The diffusion regions 408b and 408c are connected by a buried diffusion region 504. The buried diffusion region 504 possesses similar electrical characteristics as the diffusion regions 408a, 408b, and 408c. The polysilicon 410 in the Flash-EEPROM-cell provides the capacitor function and the dopant of buried diffusion 504 can be out diffused from the polysilicon 410, so this polysilicon 410 automatically contacts the buried diffusion region 504. One DRAM cell is separated from an adjacent DRAM cell by a deep trench isolation region 424. The use of a Flash-EEPROM-like cell in a DRAM cell eases the manufacturing process and also provides smaller cell structures because of self-aligned feature of the Flash EEPROM cell.

Figure 6:
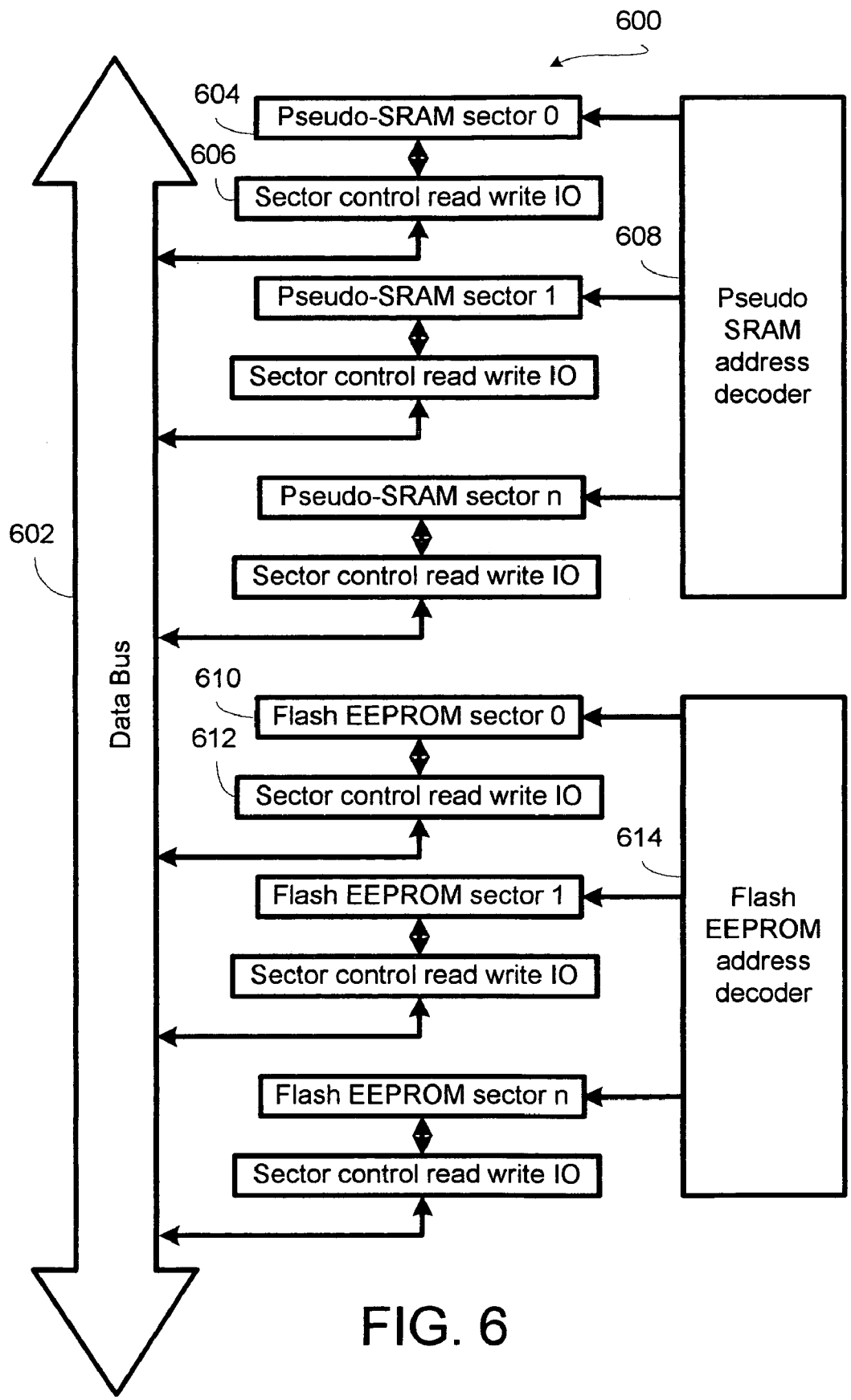
FIG. 6 is a schematic of a multi-function memory array according to one embodiment of the invention.

Flash EEPROM is used in a variety of applications; however, its use has been limited by its implementation as an isolated memory array. FIG. 6 illustrates an implementation of Flash EEPROM that greatly enhances its utility. The memory array 600 in FIG. 6 includes a plurality of Flash EEPROM divided into sectors 610, each sector having a separated read/write control 612. A Flash EEPROM in each sector 610 is connected to a data bus 602 and can be addressed by addresses from an address decoder 614. The memory array 600 also includes a plurality of pseudo static random access memory (pseudo-SRAM). A pseudo-SRAM is a DRAM accessed through an external logic typically used to control SRAM interfaces. In FIG. 6, each pseudo-SRAM sector 604 is accessed through a sector control 606 and receives addresses from a pseudo-SRAM address decoder 608. The pseudo-SRAM is also connected to the data bus 602. It is understood that the memory array 600 can employ not only the DRAM cells shown in FIGS. 4-5 but also traditional DRAM cells well known to those skilled in the art.

By placing a Flash EEPROM in the same die with a pseudo-SRAM, many advantages can be achieved. Because the Flash EEPROM is connected to the pseudo-SRAM (DRAM) by an internal data bus, data can be easily transferred between them. For example, when the chip is powering up or right after powered up, portion of the data residing inside the Flash EEPROM can be written into the DRAM, and before the chip is powered down, portion of the data residing inside the DRAM can be written back into the Flash EEPROM. These data transfer applications can fully utilize non-volatile memory characteristics of the Flash EEPROM and the fast write/read characteristics of the DRAM. The non-volatile nature of the Flash EEPROM also makes it useful for storing redundancy address information, repair information, and production information for DRAM. If a row or column of DRAM is bad, data can be re-routed to a redundant row or column by storing the re-routing information in the Flash EEPROM.

In an alternative embodiment, the pseudo-SRAM sectors may be accessed and controlled through traditional DRAM access and control circuitry, and the memory array 600 would then be a simple combination of DRAM and Flash EEPROM.

Figure 7:
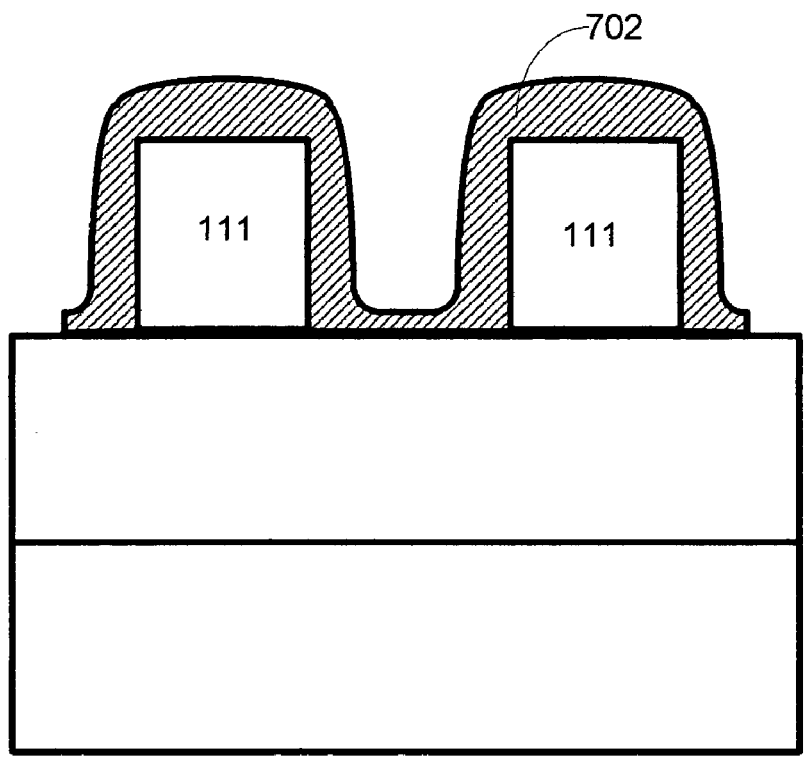
FIGS. 7-8 illustrate a spacer-defined self-aligned deep trench etching step.
Figure 8:
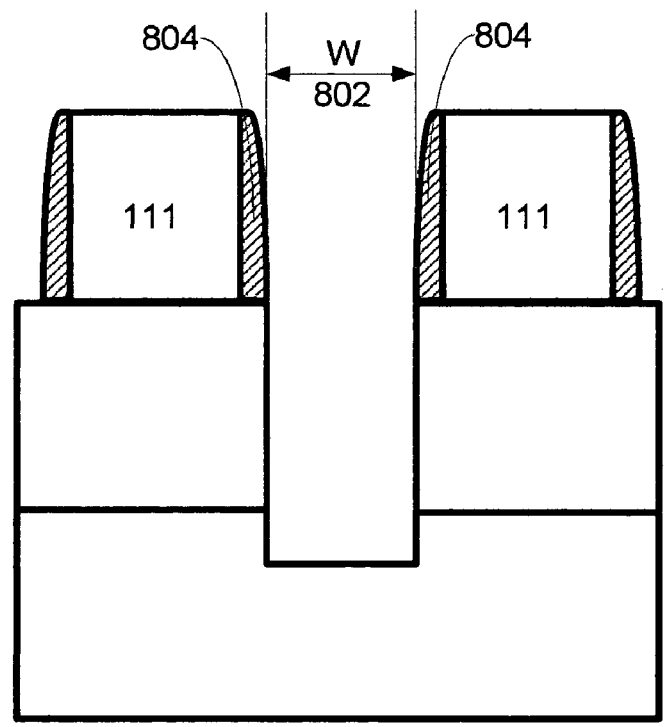

The DTI 108 used in Flash EEPROM is formed by depositing a non-conducting oxide material, such as high density plasma (HDP) oxide, in a deep trench etched through a self-aligned spacer-defined etching process. FIGS. 7-8 illustrate a spacer-defined deep trench etching process. The width of the deep trench (W) 802 is defined by spacers 804 on the side walls of two adjacent floating gates 111, the spacers 804 are formed by a conformal deposition 702 of oxide followed by an anisotropic etching. The oxide deposited on the side wall is not removed by the anisotropic etching and serves as guide for deep trench etching. Although, this deep trench etching process provides a self-alignment and enables minimization of cell structures, those skilled in the art will appreciate other processes such as photolithography may also be used.

The diffusion regions 110 are also preferably implemented through a self-aligned process and the edges of the diffusion regions 110 are aligned with the edges of the floating gate 111 and DTI 108. The self-aligned trench formation can also be applied to DRAM trench formation. FIG. 9 illustrates a set of operating voltages according to one embodiment of the invention. Those skilled in the art will appreciate other voltages may also be used.

The materials, measurements, and voltage mentioned heretofore are for illustration purposes and not intended to limit the scope of the present invention. It is recognized that as technology evolves, other suitable materials and manufacturing processes may be employed to realize the present invention. It is also understood that the structures disclosed heretofore can be easily implemented by any of existing semiconductor manufacturing processes known to those skilled in the art. Although, the present application is described for Flash EEPROMs, it is understood that the invention is equally applicable for one-time-programmable (OTP) memories, multiple-time-programmable (MTP) memories, and other non-volatile memories.

While the invention has been particularly shown and described with reference to a preferred embodiment thereof, it will be understood by those skilled in the art that various changes in form and detail may be made without departing from the spirit and scope of the present invention as set forth in the following claims. Furthermore, although elements of the invention may be described or claimed in the singular, the plural is contemplated unless limitation to the singular is explicitly stated.

What is claimed is:

1. An electrically alterable non-volatile memory device provided between a first deep trench isolation region and a second deep trench isolation region, each deep trench isolation region being filled with a dielectric material, comprising:
   a first semiconductor layer being doped with a first dopant of a first conductivity type in a first concentration;
   a second semiconductor layer adjacent the first semiconductor layer, the second semiconductor layer being doped with a second dopant of a second conductivity type opposite the first conductivity type, the second semiconductor layer further having a top side;
   first and second diffusion regions embedded in the top side of the second semiconductor layer spaced apart from each other by a first channel, wherein the first diffusion region is formed adjacent to and along the length of the first deep trench isolation region and the second diffusion region is formed adjacent to and along the length of the second deep trench isolation region, each diffusion region being doped with dopants of the first conductivity type in a second concentration greater than the first concentration;
   a floating gate disposed above the first channel region and separated therefrom by a first insulator region; and
   a control gate disposed above and electrically isolated from the floating gate;
   wherein the first and second diffusion regions are self-aligned to edges of the floating gate, and wherein the first and second deep trench isolation regions each have a width that is less than the minimum feature size.

2. The memory device of claim 1, further comprising a top isolation layer placed above the second semiconductor layer and the control gate.

3. The memory device of claim 1, wherein the first dopant is P-type and the second dopant is N-type.

4. The memory device of claim 1, wherein the first dopant is N-type and the second dopant is P-type.

5. The memory device of claim 1, wherein the first insulator region has a thickness that allows tunneling of charge between the first floating gate and the first channel region.

6. The memory device of claim 1, wherein charge is transported from the first channel region to the floating gate when a first combination of voltages is applied to the second diffusion region, the control gate, and the second semiconductor layer.

7. The memory device of claim 6 wherein the first combination of voltages comprises:
applying a voltage between 0 v and Vcc to the second semiconductor layer;
applying a negative voltage to the second diffusion region; and
applying a positive high voltage to the control gate.

8. The memory device of claim 1, wherein charge is removed from the floating gate when a second combination of voltages is applied to the first diffusion region, the control gate, and the second semiconductor layer.

9. The memory device of claim 8, wherein the second combination of voltages comprises:
applying a negative voltage to the control gate;
applying a positive voltage to the first diffusion region; and
applying a positive voltage to the second semiconductor layer.

10. The memory device of claim 1, wherein charge inside the floating gate can be determined when a third combination of voltages is applied to the first diffusion region, the second diffusion region, the control gate, and the second semiconductor layer.

11. The memory device of claim 10, wherein the third combination of voltages comprises:
applying a Vcc voltage to the second semiconductor layer;
applying a Vcc voltage to the first diffusion region;
applying a voltage between 0V and Vcc voltage to the second diffusion region;
and
applying a voltage between 0 V and Vcc to the control gate.

12. The memory device of claim 1, wherein each deep trench isolation region is formed by a self-aligned etching process.

13. The memory device of claim 12, wherein each diffusion region is formed in the self-aligned etching process.

14. An electrically alterable memory array, comprising:
a plurality of electrically alterable memory cells, each memory cell having a first connector, a second connector and a third connector, the plurality of memory cells being distributed in rows and columns, wherein the memory cells of each column are placed within a single well; and a plurality of Psuedo SRAM cells;
a plurality of word select lines, each word select line connecting to the second connector of each memory cell in one row;
a plurality of local source lines, each local source line connecting to the first connector of each memory cell in one column, each local source line being enabled by one source select gate;
a plurality of local data lines, each local data line connecting to the third connector of each memory cell in one column, each local data line being enabled by one data select gate;
wherein a first and second diffusion regions are self-aligned to edges of a floating gate,
and a plurality of deep trench isolation regions, each deep trench isolation region being filled with a dielectric material and separating adjacent columns of the memory cells, and wherein the first and second deep trench isolation regions each have a width that is less than the minimum feature size and wherein the well for one column of the memory cells can be placed at a predefined voltage when programming a memory cell in the well.

15. The memory device of claim 14, wherein the plurality of local source lines are connected to a common source line.

* * * * *